United States Patent
Stockstad

(12) 
(10) Patent No.: US 6,429,685 B1
(45) Date of Patent: Aug. 6, 2002

(54) INTEGRATED CIRCUIT AND METHOD OF CONTROLLING OUTPUT IMPEDANCE

(75) Inventor: Troy L. Stockstad, Chandler, AZ (US)

(73) Assignee: Gain Technology Corporation, Tucson, AZ (US)

( * ) Notice: Subject to any disclaimer, the term of this patent is extended or adjusted under 35 U.S.C. 154(b) by 0 days.

(21) Appl. No.: 09/711,486

(22) Filed: Nov. 13, 2000

(51) Int. Cl.[7] .......................................... H03K 19/0185
(52) U.S. Cl. ............................. 326/83; 326/30; 326/27
(58) Field of Search ............................. 326/21, 26, 27, 326/30, 83, 86, 89, 90

(56) References Cited

U.S. PATENT DOCUMENTS

| | | | | |
|---|---|---|---|---|
| 4,469,961 A | * | 9/1984 | Milberger et al. | 326/89 |
| 5,254,883 A | * | 10/1993 | Horowitz et al. | 326/87 |
| 5,767,703 A | * | 6/1998 | Fattori et al. | 327/108 |
| 5,898,321 A | | 4/1999 | Ilkbahar et al. | 326/83 |
| 6,236,246 B1 | * | 5/2001 | Leighton et al. | 327/110 |

OTHER PUBLICATIONS

Ahn, et al.; A 2–Gbaud 0.7–V Swing Voltage–Mode Driver and On–Chip Terminator for High Speed NRZ Data Transmission; *IEEE Journal of Solid State Circuits*, Jun. 2000, pp. 915–918.

* cited by examiner

*Primary Examiner*—Don Phu Le
(74) *Attorney, Agent, or Firm*—Bryan Cave LLP

(57) ABSTRACT

An integrated circuit (100, 200, 300) includes a voltage-mode driver circuit having an analog on-chip termination and also having a substantially constant output impedance across an operating range of an output voltage of the voltage-mode driver circuit. The voltage-mode driver circuit also has slew rate control of the output voltage.

34 Claims, 4 Drawing Sheets

INTEGRATED CIRCUIT AND METHOD OF CONTROLLING OUTPUT IMPEDANCE

FIELD OF THE INVENTION

This invention relates to integrated circuits, in general, and to driver circuits and methods of controlling output impedance, in particular.

BACKGROUND OF THE INVENTION

Many different types of driver circuits with on-chip termination have been developed to improve signal integrity in high-speed data communications. For example, on-chip termination provides improved signal integrity between transceivers over a transmission medium by matching the output impedance of the transceiver with the input impedance of the transmission medium. On-chip termination also provides lower system cost and lower component count.

One example of a driver circuit with on-chip termination is briefly discussed in "A 2-Gbaud 0.7-V Swing Voltage-Mode Driver and On-Chip Terminator for High-Speed NRZ Data Transmission," *IEEE Journal of Solid-State Circuits*, Volume 35, Number 6, June 2000, by Gijung Ahn, et al. The driver circuit briefly discussed by Gijung Ahn, et al., however, has the following problems. First, the termination is provided by a separate circuit from the driver circuit instead of being an integral part of the driver circuit itself. This separate circuit termination technique requires a large amount of space of a semiconductor chip. Second, the termination scheme described does not behave linearly near the supply rails, which is important for rail-to-rail output driver circuits.

Another example of a driver circuit with on-chip termination is described in U.S. Pat. No. 5,898,312, issued on Apr. 27, 1999 and invented by Alper Ilkbahar, et al. One of the many disadvantages of this type of driver circuit is its digital on-chip termination technique. For example, the digital termination technique uses discrete steps, which generates high frequency components and produces problems with Electro-Magnetic Interference (EMI). Furthermore, a large amount of space on a semiconductor chip is required to implement the digital termination technique.

Accordingly, a need exists for an improved integrated circuit and a improved method of controlling output impedance. It is desired for the integrated circuit to minimize problems associated with EMI and also with large semiconductor chip space. It is also desired for the integrated circuit to behave linearly near the supply rails.

SUMMARY OF THE INVENTION

In accordance with the principles of the invention, an integrated circuit comprises a voltage-mode driver circuit having an integral, analog on-chip termination.

Further, in accordance with the principles of the invention, an integrated circuit comprises a first three-terminal device of a first type and a second three-terminal device of the first type. A first terminal of the second three-terminal device is electrically coupled to a first terminal of the first three-terminal device, and a second terminal of the second three-terminal device is electrically coupled to a second terminal of the first three-terminal device. A reference current applied to a third terminal of the second three-terminal device generates a control voltage applied to the second terminals of the first and second three-terminal devices. The control voltage is a function of comparing an output voltage at the third terminal of the second three-terminal device to a reference voltage. The reference current is derived from the reference voltage and a reference resistance.

Still further, in accordance with the principles of the invention, a driver circuit comprises (1) a first MOSFET having a first gate electrode, a first drain electrode, and a first source electrode, (2) a first resistor coupled to the first drain electrode, (3) an output of the driver circuit coupled to the first resistor, (4) a second MOSFET having a second gate electrode, a second drain electrode, and a second source electrode, the first and second gate electrodes coupled together and the first and second source electrodes coupled together, (5) a second resistor coupled to the second drain electrode, (6) a third MOSFET having a third gate electrode, a third drain electrode, and a third source electrode, the third source electrode coupled to the second resistor, (7) an amplifier having a first amplifier input, a second amplifier input, and an amplifier output, the first amplifier input coupled to the second resistor and the third source electrode, the second amplifier input coupled to a reference voltage, and the amplifier output coupled to the third gate electrode, and (8) a current source coupled to the third drain electrode, the first gate electrode, and the second gate electrode.

Also in accordance with the principles of the invention, a method of controlling output impedance of a driver circuit comprises generating a reference current as a function of a reference voltage and a reference resistance, using a first sub-circuit to generate the output impedance of the driver circuit, using a second sub-circuit in a feedback loop to generate a control current, and using the control current to control the output impedance.

Additionally, in accordance with the principles of the invention, a method of controlling output impedance of a driver circuit comprises generating a reference voltage as a function of a reference current and a reference resistance, using a first sub-circuit to generate the output impedance of the driver circuit, using a second sub-circuit in a feedback loop to generate a control voltage, and using the control voltage to control the output impedance.

BRIEF DESCRIPTION OF THE FIGURES

The invention will be better understood from a reading of the following detailed description, taken in conjunction with the accompanying figures in which.

Figure 1:
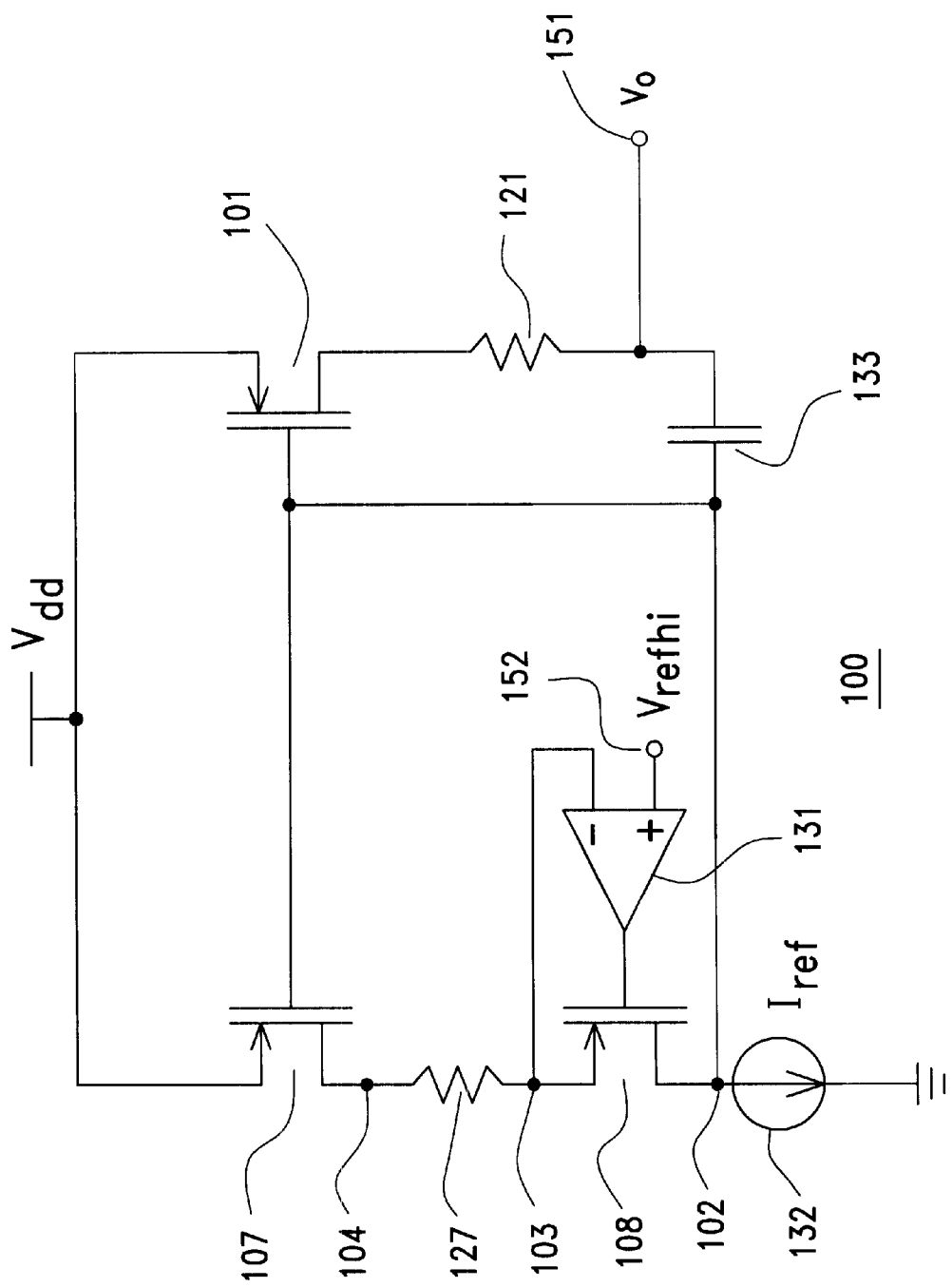
FIG. 1 illustrates a schematic diagram of an integrated circuit in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, third, fourth, fifth, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in other sequences than described or illustrated herein.

DETAILED DESCRIPTION OF THE FIGURES

FIG. 1 illustrates a circuit diagram of an integrated circuit 100. As an example, circuit 100 can represent an integrated circuit comprising a driver circuit with on-chip termination. In the preferred embodiment, circuit 100 represents an integrated circuit having a voltage-mode driver circuit with an analog on-chip termination or analog self-termination. Preferably, the termination is an integral part of the driver circuit and is not a different circuit separate from the driver circuit. Also in the preferred embodiment, the output impedance of the driver circuit is well-controlled to be substantially linear throughout an operating range of an output voltage of the driver circuit. Further in the preferred embodiment, the driver circuit controls the slew rate of its output voltage. In the preferred embodiment, circuit 100 is compatible with the Universal Serial Bus 2 (USB2) operating specifications.

As illustrated in FIG. 1, circuit 100 includes a three-terminal device 101 of a first type. As an example, the first type of three-terminal device, such as device 101, can be a Field-Effect Transistor (FET) or a bipolar transistor. The FET can be a Metal-Oxide-Semiconductor FET (MOSFET), a Junction FET (JFET), or a MEtal-Semiconductor FET (MESFET). The three terminals of a FET are a gate electrode, a drain electrode, and a source electrode. The three terminals of a bipolar transistor are a base electrode, a collector electrode, and an emitter electrode. A control electrode for a FET is the gate electrode, and a control electrode for a bipolar transistor is the base electrode. In the preferred embodiment, the first type of three-terminal device is a p-channel MOSFET. Accordingly, in the preferred embodiment, device 101 is a p-channel MOSFET having gate electrode, a drain electrode, and a source electrode where the gate electrode is the control electrode for device 101.

The term "three-terminal device" is defined as a device having at least three terminals. Therefore, the three-terminal device can also have four terminals. For example, the three-terminal device can be a FET with an additional bulk or backgate electrode that is coupled to a voltage potential. In the preferred embodiment, the bulk electrode, when used, is coupled to a ground potential, to the source electrode for an n-channel MOSFET, or to the source electrode or the positive supply rail for a p-channel MOSFET.

Circuit 100 also comprises a three-terminal device 107 of the first type. In the preferred embodiment, device 107 is a p-channel MOSFET. A first terminal, or the source electrode, of device 107 is electrically coupled to a first terminal, or the source electrode, of device 101. A second terminal, or the gate electrode, of device 107 is electrically coupled to a second terminal, or the gate electrode, of device 101. The term "coupled" is defined as directly or indirectly connected in an electrical manner.

In operation, a reference current is applied to a third terminal, or the drain electrode, of device 107 to generate a control voltage that is applied to the second electrodes of devices 101 and 107. The control voltage is a function of comparing an output voltage at the third terminal of device 107 to a reference voltage derived from the reference current and a reference resistance. In the preferred embodiment, the reference resistance is provided by a highly accurate resistor that has less than approximately 0.1 percent error. Also in the preferred embodiment, this highly accurate resistor is provided by a discrete off-chip resistor. In other embodiments, the reference resistance can be provided by a less accurate resistor and/or an on-chip resistor.

Returning to the preferred embodiment of circuit 100 illustrated in FIG. 1, circuit 100 also comprises a resistor 121. Resistor 121 is coupled to a third terminal, or the drain electrode, of device 101. An output 151 of circuit 100 is coupled to resistor 121. An output voltage ($V_o$) of circuit 100 can be measured at output 151.

Circuit 100 additionally comprises a resistor 127. Resistor 127 is coupled to the third terminal, or the drain electrode, of device 107 at a circuit node 104. In the preferred embodiment, the aforementioned reference current is applied to the third terminal of device 107 through resistor 127. Also in the preferred embodiment, the aforementioned output voltage at the third terminal of device 107 is measured from resistor 127 at a circuit node 103, which is coupled to an opposite end of resistor 127 from node 104. Node 103 is considered to be "at" the third terminal of device 107 in the preferred embodiment of circuit 100.

In an alternative embodiment, node 104 is considered to be "at" the third terminal of device 107. In this alternative embodiment, circuit 100 does not include resistor 121 or 127. Accordingly, in this alternative embodiment, the output impedance of circuit 100 measured at output 151 is not as linear as the output impedance of circuit 100 in the preferred embodiment.

Circuit 100 further comprises a three-terminal device 108 of the first type. In the preferred embodiment, device 108 is a p-channel MOSFET. Device 108 is coupled to resistor 127. In particular, a first terminal, or the source electrode, of device 108 is coupled to resistor 127 at node 103.

Circuit 100 also comprises an amplifier 131. Amplifier 131 has an output and also has two inputs, namely a negative input and a positive input. The output and the negative input of amplifier 131 are coupled in a negative feedback loop to device 108. In particular, the output of amplifier 131 is coupled to a second terminal, or the gate electrode, of device 108, and the negative input of amplifier 131 is coupled to the first terminal of device 108 at node 103. The second terminal of device 108 has a input high impedance. The negative input of amplifier 131 is also coupled to resistor 127 at node 103. The positive input of amplifier of 131 is coupled to a high reference voltage ($V_{refhi}$) 152.

In the preferred embodiment, amplifier 131 is an Operational Transconductance Amplifier (OTA). The OTA provides voltage gain for the aforementioned negative feedback loop. In the preferred embodiment, amplifier 131 does not require a buffer stage because amplifier 131 drives the high impedance second terminal of device 108. If the second terminal of device 108 requires additional drive capability, an operational amplifier that includes a gain stage and a buffer stage may be used for amplifier 131.

Circuit 100 further comprises a current source 132, which generates a reference current ($I_{ref}$). Current source 132 is coupled to device 108. In particular, current source 132 is coupled to a third terminal, or the drain electrode, of device 108 at node 102. The third terminal of device 108 and current source 132 are coupled to the second terminals of devices 101 and 107 at node 102, which is a high impedance node of circuit 100.

Circuit 100 can still further comprise a capacitor 133. Capacitor 133 couples resistor 121 and output 151 to the second terminals of devices 101 and 107, to the third terminal of device 108, and to current source 132. Capacitor 133 provides slew rate control of the output voltage ($V_o$) at output 151. The output voltage at output 151 can have a maximum rate of change determined by capacitor 133 and current source 132.

Circuit 100 can additionally comprise two power supplies. In the embodiment illustrated in FIG. 1, however, circuit 100 only has a single power supply ($V_{dd}$). As an example, the single power supply can have a voltage of approximately 3.3 volts. The single power supply ($V_{dd}$) is coupled to the first terminals of devices 101 and 107. A ground potential is coupled to current source 132.

As indicated earlier, it is desired for an output impedance measured at output 151 of circuit 100 to be substantially linear within the operating range of the output voltage ($V_o$) at output 151 of circuit 100. Accordingly, the output impedance of circuit 100 preferably does not consist solely of the output impedance of a transistor because of the inherent non-linearity of the output impedance of a transistor. The impedance of a passive resistor is inherently linear, but the output impedance of circuit 100 preferably does not consist solely of the impedance of a passive resistor because a passive resistor cannot compensate for variations in operating temperature or for voltage coefficient problems. For example, if resistor 121 is a diffused on-chip resistor, the voltage applied to resistor 121 can substantially change its resistance value due to depletion effects in the resistor as the applied voltage increases.

In the preferred embodiment, the output impedance measured at output 151 of circuit 100 is preferably comprised of the impedance of a resistor, namely resistor 121, and the output impedance of a transistor, namely device 101. Device 101 adjusts its output impedance to compensate for the applied voltage-induced depletion effects within resistor 121 such that the total effective output impedance measured or seen at output 151 remains the same. Similarly, as the impedance of resistor 121 changes with temperature, device 101 adjusts its impedance to compensate for the temperature effects within resistor 121 such that the total effective output impedance seen at output 151 remains the same.

Also in the preferred embodiment, the impedance of resistor 121 is greater than the output impedance of device 101 to keep the output impedance at output 151 of circuit 100 substantially linear across the operating range of the output voltage ($V_o$) at output 151. For example, if the output impedance measured at output 151 is desired to be approximately forty-five ohms, then the impedance of resistor 121 and the output impedance of device 101 can be approximately thirty-five ohms and ten ohms, respectively. The output impedance of device 101 is preferably not greater than the impedance of resistor 121 because, as indicated earlier, the output impedance of a transistor is not as linear as the impedance of a resistor.

It is also desired for circuit 100 to consume as little power as possible to extend battery life when circuit 100 is part of a portable electronic component. Accordingly, the magnitude of the reference current ($I_{ref}$) generated by current source 132 is preferably kept to a minimum. In the preferred embodiment, the reference current ($I_{ref}$) is approximately eight hundred microAmperes. To minimize the magnitude of the reference current, certain circuit elements within circuit 100 are scaled relative to other circuit elements within circuit 100.

For example, device 101 and resistor 121 form a first sub-circuit within circuit 100, and device 107 and resistor 127 form a second sub-circuit within circuit 100. The first sub-circuit is a scaled version or replica of the second sub-circuit, or vice-versa. In particular, device 101 and resistor 121 are scaled to have lower impedances than device 107 and resistor 127, respectively, to reduce the magnitude of the reference current ($I_{ref}$) required to be generated by current source 132.

More specifically, device 101 can be scaled to have an output impedance that is approximately twenty times smaller than the output impedance of device 107. As an example device 101 can be scaled to be approximately twenty times larger than device 107. Accordingly, device 101 can have an impedance of approximately ten ohms, and device 107 can have an impedance of approximately two hundred ohms.

Also, resistor 121 can be scaled to have an impedance that is approximately twenty times smaller than the impedance of resistor 127. As an example, resistor 121 can be comprised of twenty resistors connected together in parallel, where each of the twenty resistors are similar to resistor 127. Accordingly, resistor 121 can have an impedance of approximately thirty-five ohms, and resistor 127 can have an impedance of approximately seven hundred ohms.

One skilled in the art will understand that the impedance ratios between resistors 127 and 121 and between devices 107 and 101 can have values other than twenty. In an alternative embodiment, the impedances of device 107 and resistor 127 can even be smaller than that of device 101 and resistor 121, respectively, but then current source 132 needs to generate a larger reference current.

The operation of circuit 100 is as follows. First, circuit 100 uses current source 132 to generate the reference current ($I_{ref}$). The reference current is preferably derived from the ratio of high reference voltage ($V_{refhi}$) 152 and the aforementioned highly accurate, discrete, off-chip resistor. High reference voltage ($V_{refhi}$) 152 is calculated by subtracting a master reference voltage from the power supply ($V_{dd}$). This derivation of the reference current ($I_{ref}$) ensures that the reference current will track the changes in the high reference voltage caused by variations in the manufacturing process, supply voltage, and/or circuit operating temperature. As an example, the power supply ($V_{dd}$), the master reference voltage, high reference voltage ($V_{refhi}$) 152, and the off-chip resistor can be approximately 3.3 volts, 0.72 volts, 2.58 volts, and nine hundred ohms, respectively, to create an eight hundred microAmpere current for the reference current ($I_{ref}$).

When the reference current ($I_{ref}$) is initially generated by current source 132 and is first applied to the third terminal of device 108, device 108 does not output any current at the third terminal, or drain electrode, of device 108. Therefore, the voltage at the third terminal of device 108, or a node 102, will decrease. The decrease in voltage at node 102 decreases the control voltage at the second terminals, or gate electrodes, of devices 101 and 107 and turns on devices 101 and 107. Now, devices 101 and 107 begin to conduct current. A current from device 101 travels from the third terminal, or drain electrode, of device 101 through resistor 121 to output 151 of circuit 100. Simultaneously, a current from device 107 travels from the third terminal, or drain electrode, of device 107 through resistor 127 to the first terminal, or source electrode, of device 108. Device 108 conducts the current from the first terminal of device 108 to the third terminal of device 108 and back to current source 132.

As explained earlier, device 108 is coupled in a negative feedback loop with amplifier 131. Amplifier 131 drives the negative feedback loop until the voltage at the first terminal of device 108, or at node 103, approximately equals high reference voltage ($V_{refhi}$) 152, which stabilizes the negative feedback loop. The voltage at node 103 will equal high reference voltage 152 when the current conducted through device 108 is approximately equal to the reference current ($I_{ref}$) from current source 132. When the negative feedback loop stabilizes, the voltage at node 102 will also stabilize at an appropriate value to cause the current through device 108 to be substantially equal to the reference current ($I_{ref}$) from current source 132. Furthermore, when the negative feedback loop stabilizes, the impedance measured at node 103 is approximately equal to the impedance of the highly accurate, discrete, off-chip resistor.

As also explained earlier, device 101 and resistor 121 are scaled replicas of device 107 and resistor 127, respectively. Similarly, output 151 is the scaled replica of node 103. In the preferred embodiment where the impedances of device 107 and resistor 127 are approximately twenty times larger than the impedances of device 101 and resistor 121, respectively, the impedance measured at node 103 is approximately twenty times larger than the impedance measured at output 151. Accordingly, when the negative feedback loop stabilizes, the impedance measured at output 151 is approximately forty-five ohms, and the impedance measured at node 103 is approximately nine hundred ohms. Thus, the sub-circuit comprised of device 107 and resistor 127 is used with the negative feedback loop to generate a control voltage that is used to control the output impedance of circuit 100.

Figure 2:
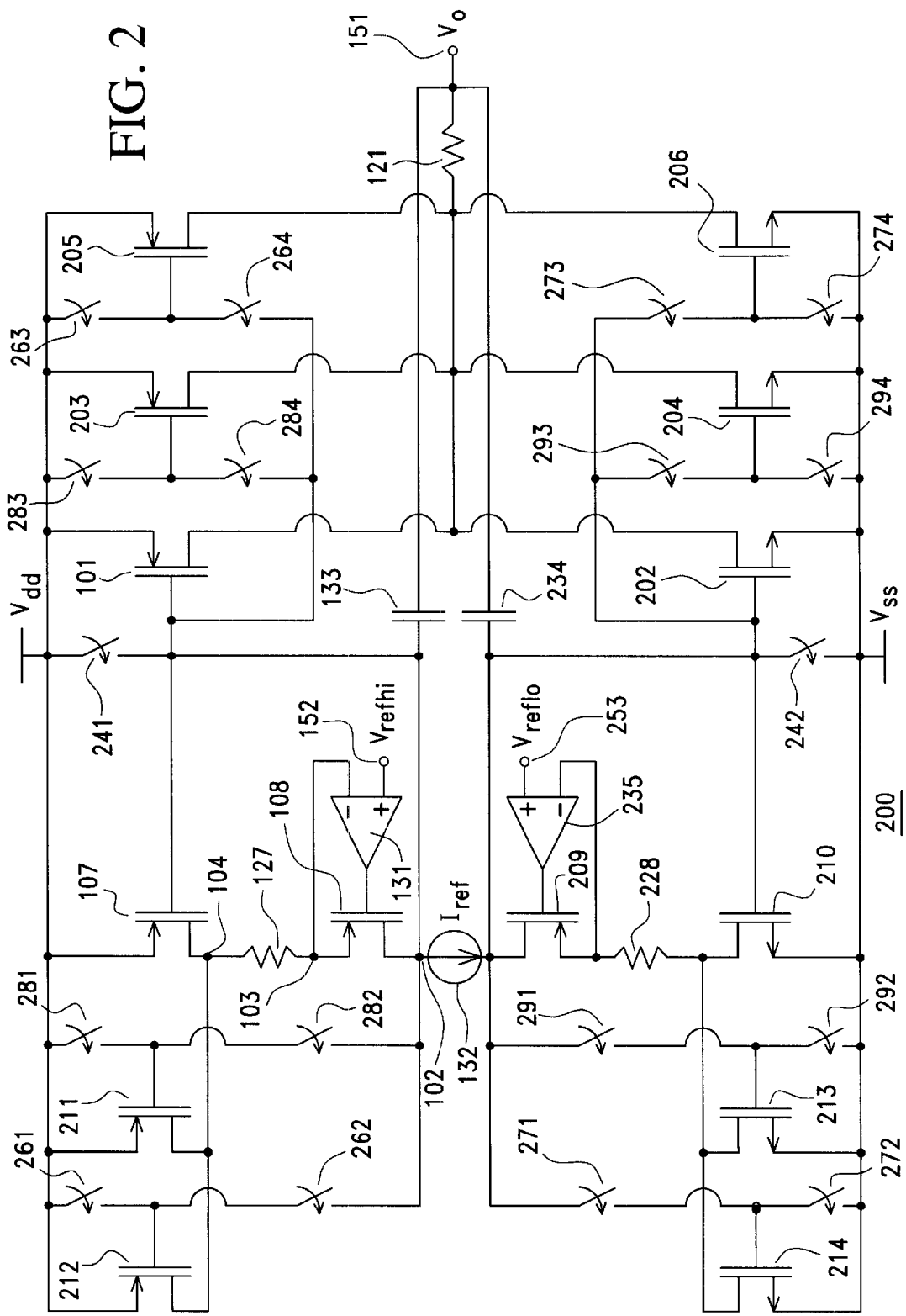
FIG. 2 illustrates a schematic diagram of a larger integrated circuit in accordance with an embodiment of the invention.

FIG. 2 illustrates a circuit diagram of an integrated circuit 200. Circuit 100 of FIG. 1 is a portion of circuit 200 in FIG. 2. Accordingly, devices 101, 107, and 108, resistors 121 and 127, amplifier 131, current source 132, capacitor 133, and output 151 in circuit 100 of FIG. 1 are also portions of circuit 200 in FIG. 2.

Circuit 200 can additionally comprise an optional three-terminal device 203 of the first type. In the preferred embodiment, device 203 is a p-channel MOSFET that is the same size as device 101. A first terminal, or source electrode, of device 203 is electrically coupled to the first terminals of devices 101 and 107 and to the power supply ($V_{dd}$). A second terminal, or gate electrode, of device 203 is removably and electrically coupled to the second terminals of devices 101 and 107 and to the first terminals of devices 101, 107, and 203. A third terminal, or drain electrode, of device 203 is coupled to the third terminal of device 101 and also to resistor 121.

When circuit 200 includes device 203, circuit 200 also includes switches 283 and 284. Switch 283 removably couples the second terminal of device 203 to the first terminals of devices 101, 107, and 203 and to the power supply ($V_{dd}$). Switch 284 removably couples the second terminal of device 203 to the second terminals of devices 101 and 107, to capacitor 133, to the third terminal of device 108, and to current source 132. As explained in more detail hereinafter, switches 283 and 284 are preferably opened and closed simultaneously with each other.

Circuit 200 can further comprise an optional three-terminal device 205 of the first type. In the preferred embodiment, device 205 is a p-channel MOSFET that is the same size as device 101. A first terminal, or source electrode, of device 205 is electrically coupled to the first terminals of devices 101, 107, and 203 and to the power supply ($V_{dd}$). A second terminal, or gate electrode, of device 205 is removably and electrically coupled to the second terminals of devices 101 and 107 and to the first terminals of devices 101, 107, 203, and 205. A third terminal, or drain electrode, of device 205 is coupled to the third terminals of device 101 and 203 and also to resistor 121.

When circuit 200 includes device 205, circuit 200 also includes switches 263 and 264. Switch 263 removably couples the second terminal of device 205 to the first terminals of devices 101, 107, 203, and 205 and to the power supply ($V_{dd}$). Switch 264 removably couples the second terminal of device 205 to the second terminals of devices 101 and 107, to capacitor 133, to the third terminal of device 108, and to current source 132. As explained in more detail hereinafter, switches 263 and 264 are preferably opened and closed simultaneously with each other.

Circuit 200 additionally comprises a switch 241. Switch 241 couples the second terminals of devices 101 and 107, the third terminal of device 108, current source 132, and capacitor 133 to the power supply ($V_{dd}$) and to the first terminals of devices 101, 107, 203, and 205. As explained in more detail hereinafter, switch 241 turns a portion of circuit 200 on and off.

Circuit 200 also comprises an optional three-terminal device 211 of the first type. In the preferred embodiment, device 211 is a p-channel MOSFET that is the same size as device 107. Also in the preferred embodiment, circuit 200 includes device 211 when circuit 200 includes device 203. A first terminal, or source electrode, of device 211 is electrically coupled to the first terminals of devices 101, 107, 203, and 205 and to the power supply ($V_{dd}$). A second terminal, or gate electrode, of device 211 is removably coupled to current source 132, to capacitor 133, to the third terminal of device 108, to the first terminals of devices 101, 107, 203, 205, and 211, to the second terminals of devices 101 and 107, and to the power supply ($V_{dd}$). A third terminal, or drain electrode, of device 211 is electrically coupled to the third terminal of device 107 and also to resistor 127.

When circuit 200 includes device 211, circuit 200 also includes switches 281 and 282. Switch 281 electrically and removably couples the second terminal of device 211 to the first terminals of devices 101, 107, 203, 205, and 211 and to the power supply ($V_{dd}$). Switch 282 removably and electrically couples the second terminal of device 211 to current source 132, capacitor 133, the third terminal of device 108, and the second terminals of devices 101 and 107. As explained in more detail hereinafter, switches 281 and 282 are preferably opened and closed simultaneously with each other and with switches 283 and 284.

Circuit 200 can also comprise an optional three-terminal device 212 of the first type. In the preferred embodiment, device 212 is a p-channel MOSFET that is the same size as device 107. Also in the preferred embodiment, circuit 200 includes device 212 when circuit 200 includes device 205. A first terminal, or source electrode, of device 212 is electrically coupled to the first terminals of devices 101, 107, 203, 205, and 211 and to the power supply ($V_{dd}$). A second terminal, or gate electrode, of device 212 is removably coupled to current source 132, to capacitor 133, to the third terminal of device 108, to the first terminals of devices 101, 107, 203, 205, 211, and 212, to the second terminals of devices 101 and 107, and to the power supply ($V_{dd}$). A third terminal, or drain electrode, of device 212 is electrically coupled to the third terminal of devices 107 and 211 and also to resistor 127.

When circuit 200 includes device 212, circuit 200 also includes switches 261 and 262. Switch 261 electrically and removably couples the second terminal of device 212 to the first terminals of devices 101, 107, 203, 205, 211, and 212 and to the power supply ($V_{dd}$). Switch 262 removably and electrically couples the second terminal of device 212 to current source 132, capacitor 133, the third terminal of device 108, and the second terminals of devices 101 and 107. As explained in more detail hereinafter, switches 261 and 262 are preferably opened and closed simultaneously with each other and with switches 263 and 264.

Devices 101, 107, 108, 203, 205, 211, and 212, switches 241, 261, 262, 263, 264, 281, 282, 283, and 284, resistor 127, amplifier 131, and capacitor 133 form a first portion or p-side of circuit 200. Circuit 200 further comprises a second portion or n-side, which is a "mirror image" of the first portion or p-side. As an example, this second portion or n-side of circuit 200 comprises, among other things, three-terminal devices 202, 204, 206, 209, 210, 213, and 214 of a second type. As an example, the second type of three-terminal device, such as each of devices 202, 204, 206, 209, 210, 213, and 214, can be a FET or a bipolar transistor. The FET can be a MOSFET, a JFET, or a MESFET. In the preferred embodiment, the second type of three-terminal device, such as each of devices 202, 204, 206, 209, 210, 213, and 214, is an n-channel MOSFET. Devices 202, 204, 206, 209, 210, 213, and 214 are the "mirrored devices" or counterparts to devices 101, 203, 205, 108, 107, 211, and 212, respectively.

The second portion, or n-side, of circuit 200 further comprises switches 242, 271, 272, 273, 274, 291, 292, 293, and 294, which are the counterparts to switches 241, 261, 262, 263, 264, 281, 282, 283, and 284, respectively. The second portion of circuit 200 additionally comprises a resistor 228, a capacitor 234, an amplifier 235, and a switch 242, which are the counterparts to resistor 127, capacitor 133, amplifier 131, and switch 241, respectively, in the first portion of circuit 200. Amplifier 235 has an output and two inputs, namely a negative input and a positive input. The output and the negative input of amplifier 235 are coupled in a negative feedback loop with device 209. The positive input of amplifier 235 is coupled to a low reference voltage ($V_{reflo}$) 253. Low reference voltage ($V_{reflo}$) 253 can be calculated by subtracting a second power supply ($V_{ss}$) from the master reference voltage.

In the embodiment illustrated in FIG. 2, the second power supply ($V_{ss}$) is coupled to the first terminals of devices 202, 204, 206, 210, 213, and 214 and is also coupled to switches 242, 272, 274, 292, and 294. The first power supply ($V_{dd}$) is coupled to the first terminals of devices 101, 107, 203, 205, 211, and 212 and is also coupled to switches 241, 261, 263, 281, and 283. As an example, the first power supply ($V_{dd}$) can have a voltage of approximately 3.3 volts, and the second power supply ($V_{ss}$) can have a voltage of approximately 0 volts.

Circuit 100 in FIG. 1 represents the main portion of the first portion or p-side of circuit 200 in FIG. 2. The operation of the main portion of the first portion of circuit 200 has already been discussed with reference to FIG. 1. One skilled in the art will understand that the circuit elements of the second portion or n-side of circuit 200 in FIG. 2, which correspond to the circuit elements in the main portion of the first portion or p-side of circuit 200 in FIG. 2, operate in a similar manner.

The main portion of the first portion of circuit 200 in FIG. 2 acts as a bias circuit. To convert the bias circuit into a driver, output devices such as devices 101, 203, and 205 in the bias circuit need to be turned on and off. The addition of switch 241 converts the bias circuit into a driver circuit by enabling the output devices in the bias circuit to be turned on and off. When switch 241 is open, the output devices may conduct current, and when switch 241 is closed, the output devices are turned off and do not conduct current.

Switch 242 in the second portion or n-side of circuit 200 serves a similar function for the main portion of the second portion or n-side of circuit 200. When switch 242 is open, the output devices, such as devices 202, 204, and 206, in the second portion of circuit 200 may conduct current, and when switch 242 is closed, devices 202, 204, and 206 in the second portion of circuit 200 are off and do not conduct current. Switches 241 and 242 can be closed at the same time to provide a high impedance output for circuit 200. Switches 241 and 242 are preferably not open at the same time.

Capacitors 133 and 234 control the slew rate of the output voltage ($V_o$) at output 151 of circuit 200. Capacitor 133 couples output 151 and resistor 121 to the high impedance node, or node 102, of the first portion, or p-side, of circuit 200. Capacitor 234 couples output 151 and resistor 121 to the high impedance node of the second portion or n-side of circuit 200. The rate of change in the output voltage ($V_O$) is limited by the slew rates of capacitors 133 and 234 and the available slewing or reference current ($I_{ref}$) from current source 132 when the output voltage ($V_o$) changes from a high state to a low state or vice versa.

More specifically, when the output voltage at output 151 changes from a high state to a low state, switch 241 is closed, and switch 242 is open. Under these conditions, the first portion, or p-side, of circuit 200 is off or inactive, and the second portion, or n-side, of circuit 200 is on or active. Thus, capacitor 234 controls the slew rate of the output voltage at output 151 when the output of circuit 200 changes from a high state to a low state.

When the output voltage at output 151 changes from a low state to a high state, however, switch 241 is open, and switch 242 is closed. Under these conditions, the first portion, or p-side, of circuit 200 is on or active, and the second portion, or n-side, of circuit 200 is off or inactive. Thus, capacitor 133 controls the slew rate of the output voltage at output 151 when the output of circuit 200 changes from a low state to a high state.

Optional devices 203, 204, 205, 206, 211, 212, 213, and 214 and optional switches 261, 262, 263, 264, 271, 272, 273, 274, 281, 282, 283, 284, 291, 292, 293, and 294 can be included in circuit 200 to compensate for manufacturing variations in the sheet resistance, or doping level, of the polycrystalline silicon (polysilicon) material used to form resistors 121, 127, and 228. For example, the sheet resistance of the polysilicon material used to form resistors 121, 127, and 228 can vary approximately twenty percent or more of a target sheet resistance. The evaluation of the sheet resistance can be performed by comparing the resistance of resistor 121 to the resistance of the highly accurate, discrete, off-chip resistor.

Under a first set of conditions where the sheet resistance of the polysilicon material used to form resistors 121, 127, and 228 is within approximately ten percent of a target sheet resistance, then switches 281, 282, 283, and 284 and/or switches 291, 292, 293, and 294 can be closed or can be turned on while switches 261, 262, 263, and 264 and/or switches 271, 272, 273, and 274 can be opened or turned off. If the first portion, or p-side, of circuit 200 is active and the second portion, or n-side, of circuit 200 is inactive, then switches 281, 282, 283, and 284 are closed while switches 261, 262, 263, and 264 are open. On the other hand, if the first portion, or p-side, of circuit 200 is inactive and the second portion, or n-side, of circuit 200 is active, then switches 291, 292, 293, and 294 are closed while switches 271, 272, 273, and 274 are open. Under this first set of conditions and in the preferred embodiment, switches 281, 282, 283, 284, 291, 292, 293, and 294 remain closed while switches 261, 262, 263, 264, 271, 272, 273, and 274 remain open regardless of whether the first or second portion of circuit 200 is active.

Under this first set of conditions, optional devices 203 and 211 and/or optional devices 204 and 213 are used to conduct current in circuit 200 while optional devices 205, 206, 212, and 214 are not used in circuit 200. Here, when circuit 200 is not in a high output impedance state, the output impedance measured at output 151 of circuit 200 comprises the impedance of resistor 121 and the output impedances of devices 101 and 203 or devices 202 and 204. The output impedances of devices 101 and 203 are in parallel with each other and are in series with the impedance of resistor 121, and the output impedances of devices 202 and 204 are in parallel with each other and are in series with the impedance of resistor 121.

Under a second set of conditions, the sheet resistance of the polysilicon material used to form resistors 121, 127, and 228 is ninety percent or less than the target sheet resistance. Here, the sheet resistance of resistors 121, 127, and 228 is low, and the resistance of resistors 121, 127, and 228 is low. Under this second set of conditions, resistor 121 contributes to a smaller portion of the output impedance measured at output 151 of circuit 200 than under the first set of conditions. Accordingly, a larger portion of the output impedance measured at output 151 is from the output impedance of transistors than under the first set of conditions.

To increase the magnitude of transistor output impedance measured at output 151, a fewer number of transistors are used in parallel with each other compared to the situation described earlier for the first set of conditions. Switches 261, 262, 263, 264, 281, 282, 283, and 284 and/or switches 271, 272, 273, 274, 291, 292, 293, and 294 can be turned off or can be opened. If the first portion, or p-side, of circuit 200 is active and the second portion, or n-side, of circuit 200 is inactive, then switches 261, 262, 263, 264, 281, 282, 283, and 284 are open. On the other hand, if the first portion, or p-side, of circuit 200 is inactive and the second portion, or n-side, of circuit 200 is active, then switches 271, 272, 273, 274, 291, 292, 293, and 294 are open. Under this second set of conditions and in the preferred embodiment, all of switches 261, 262, 263, 264, 271, 272, 273, 274, 281, 282, 283, 284, 291, 292, 293, and 294 remain open regardless of whether the first or second portion of circuit 200 is active.

Under this second set of conditions, optional devices 203, 205, 211, and 212 and/or optional devices 204, 206, 213, and 214 are not used in circuit 200. Here, when circuit 200 is not in a high output impedance state, the output impedance measured at output 151 of circuit 200 comprises the impedance of resistor 121 in series with the output impedance of device 101 or 202.

Under a third set of conditions, the sheet resistance of the polysilicon material used to form resistors 121, 127, and 228 is one hundred and ten percent or greater than the target sheet resistance. Here, the sheet resistance of resistors 121, 127, and 228 is high such that the resistance of resistors 121, 127, and 228 is high. Under this third set of conditions, resistor 121 contributes to a larger portion of the output impedance measured at output 151 of circuit 200 than under the first set of conditions. Accordingly, a smaller portion of the output impedance measured at output 151 is from the output impedance of transistors than under the first set of conditions.

To reduce the magnitude of transistor output impedance measured at output 151, a larger number of transistors are used in parallel compared to the situation described earlier for the first set of conditions. Switches 261, 262, 263, 264, 281, 282, 283, and 284 and/or switches 271, 272, 273, 274, 291, 292, 293, and 294 can be turned on or can be closed. If the first portion, or p-side, of circuit 200 is active and the second portion, or n-side, of circuit 200 is inactive, then switches 261, 262, 263, 264, 281, 282, 283, and 284 are closed. On the other hand, if the first portion, or p-side, of circuit 200 is inactive and the second portion, or n-side, of circuit 200 is active, then switches 271, 272, 273, 274, 291, 292, 293, and 294 are closed. Under this third set of conditions and in the preferred embodiment, all of switches 261, 262, 263, 264, 271, 272, 273, 274, 281, 282, 283, 284, 291, 292, 293, and 294 remain closed regardless of whether the first or second portion of circuit 200 is active.

Under this third set of conditions, optional devices 203, 205, 211, and 212 and/or optional devices 204, 206, 213, and 214 are used to conduct current. Here, when circuit 200 is not in a high output impedance state, the output impedance measured at output 151 of circuit 200 comprises the impedance of resistor 121 and the output impedances of devices 101, 203, and 205 or devices 202, 204, and 206. The output impedances of devices 101, 203, and 205 are in parallel with each other and are in series with the impedance of resistor 121, and the output impedances of devices 202, 204, and 206 are in parallel with each other and are in series with the impedance of resistor 121.

Figure 3:
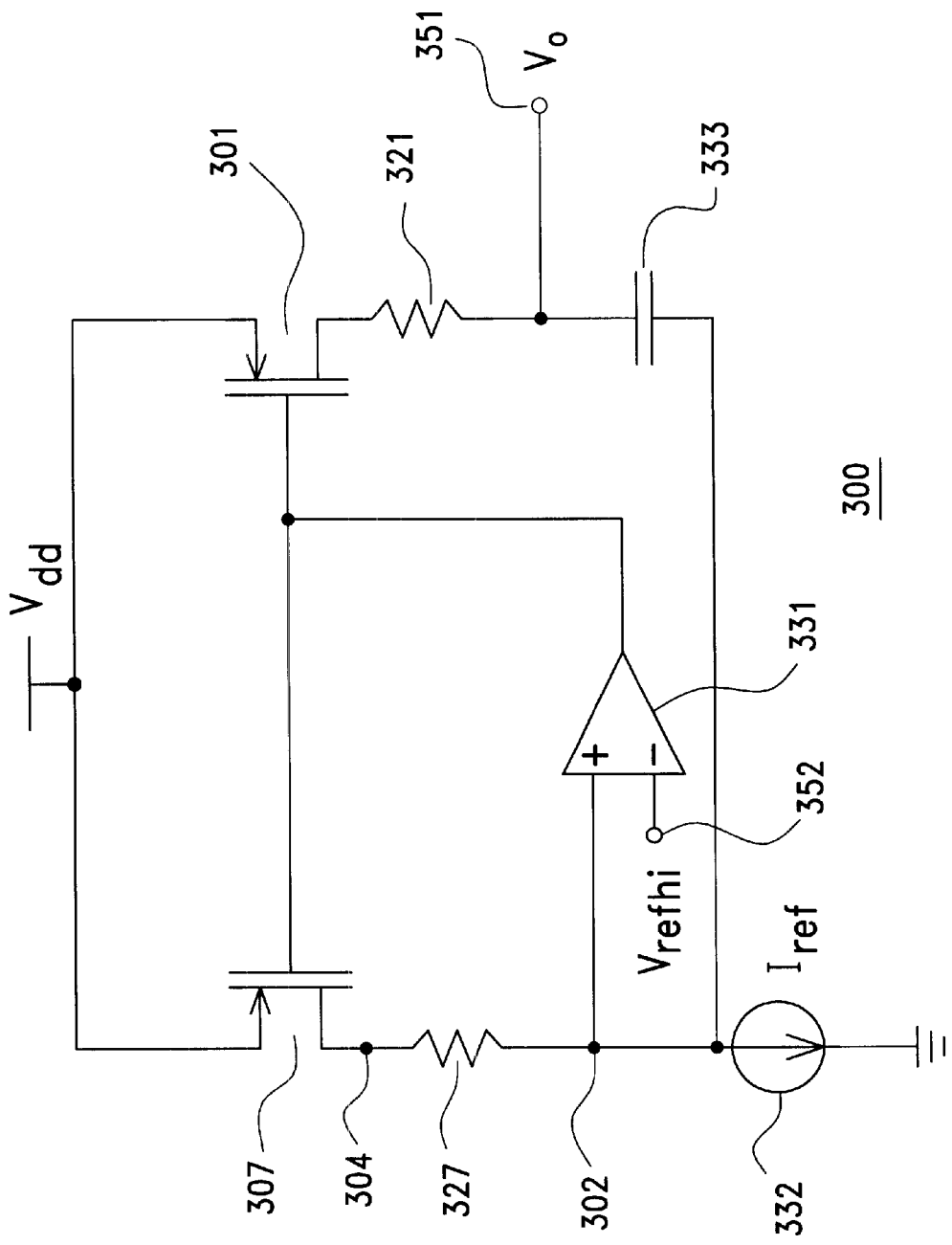
FIG. 3 illustrates a schematic diagram of a different integrated circuit in accordance with an embodiment of the invention.

FIG. 3 illustrates a circuit diagram of an integrated circuit 300, which is an alternative embodiment to circuit 100 in FIG. 1. As an example, circuit 300 can represent an integrated circuit comprising a driver circuit with on-chip termination. In the preferred embodiment, circuit 300 represents an integrated circuit having a voltage-mode driver circuit with an analog on-chip termination or analog self-termination. Preferably, the termination is an integral part of the driver circuit and is not a different circuit separate from the driver circuit. Also in the preferred embodiment, the output impedance of the driver circuit is well-controlled to be substantially linear throughout an output voltage operating range of the driver circuit. Further in the preferred embodiment, the driver circuit controls the slew rate of its output voltage. In the preferred embodiment, circuit 300 is compatible with the Universal Serial Bus 2 (USB2) operating specifications.

As illustrated in FIG. 3, circuit 300 comprises three-terminal devices 301 and 307 of the first type. In the preferred embodiment, devices 301 and 307 are p-channel MOSFETs. Devices 301 and 307 can be similar to devices 101 and 107, respectively, in FIG. 1.

In operation, a reference current is applied to a third terminal, or the drain electrode, of device 307 in FIG. 3 to generate a control voltage that is applied to the second electrodes of devices 301 and 307. The control voltage is a function of comparing an output voltage at the third terminal of device 307 to a reference voltage derived from the reference current and a reference resistance. In the preferred embodiment, the reference resistance is provided by a highly accurate resistor that has less than approximately 0.1 percent error. Also in the preferred embodiment, this highly accurate resistor is provided by a discrete off-chip resistor. In other embodiments, the reference resistance can be provided by a less accurate resistor and/or an onchip resistor.

Circuit 300 additionally comprises resistors 321 and 327, which can be similar to resistors 121 and 127, respectively, of FIG. 1. Device 307 and resistor 327 in FIG. 3 are replicas of device 301 and resistor 321, respectively, in FIG. 3. Device 307 and resistor 327 are preferably scaled replicas of device 301 and resistor 321, respectively, similar to the scaled replica relationship between devices 107 and 101 in FIG. 1 and between resistors 127 and 121 in FIG. 1. Similar to devices 101 and 107 and resistors 121 and 127 in FIG. 1, device 301 and resistor 321 form a sub-circuit that is a scaled version or replica of another sub-circuit comprised of device 307 and resistor 321.

Circuit 300 further comprises a current source 332 and an amplifier 331, which can be similar to current source 132 and amplifier 131, respectively, in FIG. 1. In the preferred embodiment, amplifier 331 in FIG. 3 is an OTA having two inputs, namely a negative input and a positive input. The negative input of amplifier 331 is coupled to a reference voltage ($V_{refhi}$) 352. Device 307 and resistor 327 are coupled together in a feedback loop with the positive input and the output of amplifier 331.

Circuit 300 also has an output 351, which can be similar to output 151 in FIG. 1. Circuit 300 in FIG. 3 has an output voltage ($V_o$) at output 351. An output impedance measured at output 351 of circuit 300 is preferably substantially linear within an operating range of the output voltage ($V_o$) at output 351.

Circuit 300 further comprises a capacitor 333, which can be similar to capacitor 133 in FIG. 1. Capacitor 333 in FIG. 3 couples output 351 and resistor 321 to node 302 for controlling the slew rate of the output voltage ($V_o$) at output 351.

The operation of circuit 300 in FIG. 3 is similar to that of circuit 100 in FIG. 1. Current source 332 generates a reference current ($I_{ref}$), which is applied to the third terminal, or drain electrode, of device 307. Device 307, however, does not output any current at its third terminal. Therefore, the voltage at high impedance node 302 will decrease. Amplifier 331 senses the voltage at node 302 and compares this voltage to reference voltage 352. If the voltage at high impedance node 302 is lower in potential than reference voltage 352, then amplifier 331 drives the second terminals, or control electrodes, of devices 301 and 307 negative. This action turns on devices 301 and 307, which causes currents to flow through device 307 and resistor 327 and through device 301 and resistor 321. Consequently, the voltage at node 302 and output 351 will increase until circuit 300 reaches equilibrium where the voltage at node 302 equals reference voltage 352.

This stable state defines an impedance at node 302, through resistor 327 and device 307, referenced to the power supply ($V_{dd}$). Because device 301 and resistor 321 are scaled replicas of device 307 and resistor 327, respectively, the output impedance of circuit 300 is well defined at output 351. Thus, the sub-circuit comprised of device 307 and resistor 327 is used with or in the feedback loop to generate a control voltage that is used to control the output impedance of circuit 300. Capacitor 333 controls the output voltage ($V_O$) slew rate, which is defined by capacitor 333 and the reference current ($I_{ref}$) from current source 332.

In the preferred embodiment, the aforementioned output voltage at the third terminal of device 307 is measured from resistor 327 at node 302, which is coupled to an opposite end of resistor 327 from a circuit node 304. Node 302 is considered to be "at" the third terminal of device 307 in the preferred embodiment of circuit 300. In an alternative embodiment, node 304 is considered to be "at" the third terminal of device 307. In this alternative embodiment, circuit 300 does not include resistor 321 or 327. Accordingly, in this alternative embodiment, the output impedance of circuit 300 measured at output 351 is not as linear as the output impedance of circuit 300 in the preferred embodiment.

Figure 4:
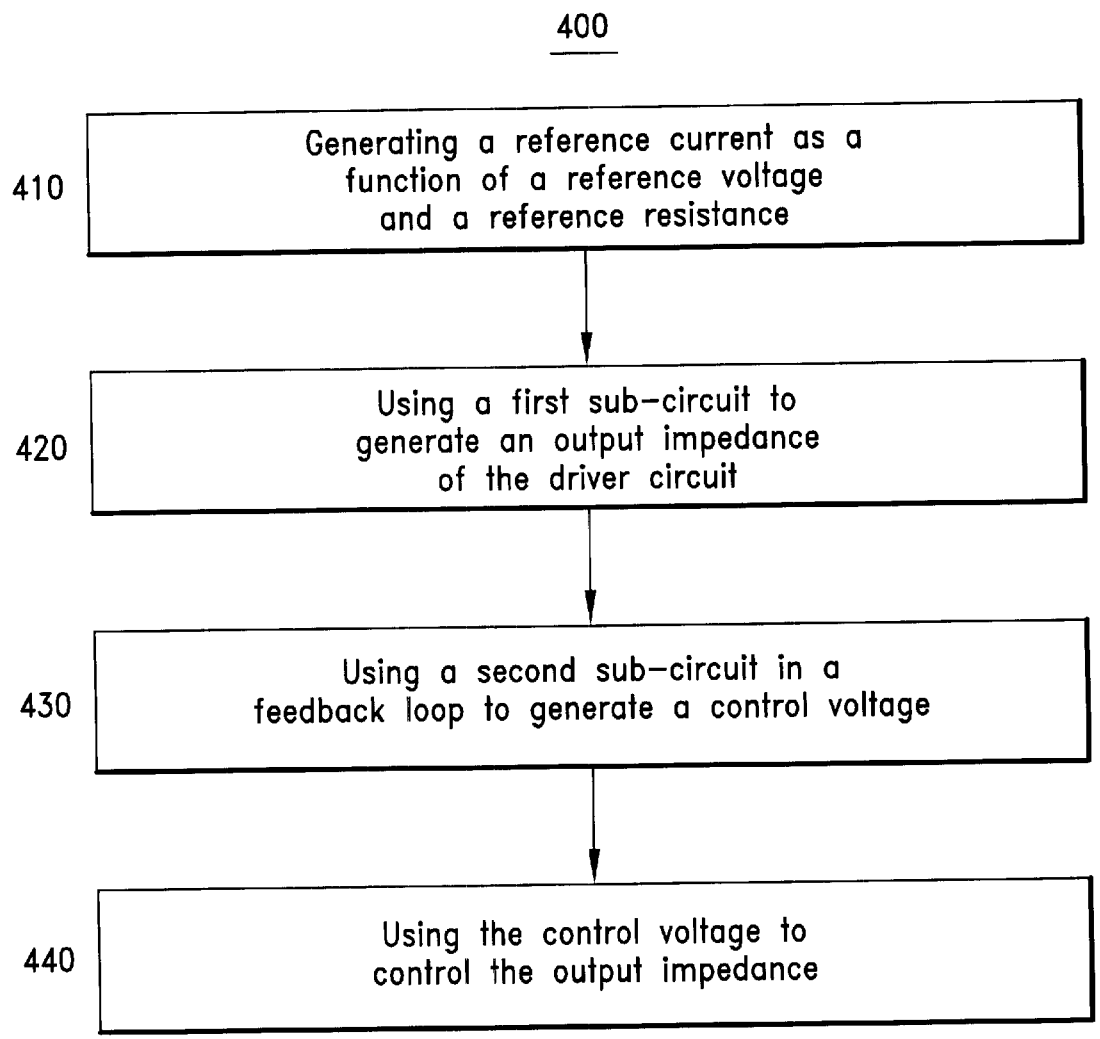
FIG. 4 illustrates a flow chart of a method of controlling output impedance of an integrated circuit in accordance with an embodiment of the invention.

FIG. 4 illustrates a flow chart 400 of a method of controlling output impedance of an integrated circuit. As an example, the operation of the circuit described in flow chart 400 can be the operation of circuit 100, 200, or 300 in FIGS. 1, 2, and 3, respectively.

At a step 410 of flow chart 400, a reference current is generated as a function of a reference voltage and a reference resistance. At a step 420 of flow chart 400, a first sub-circuit is used to generate an output impedance of the circuit. At a step 430 of flow chart 400, a second sub-circuit is used in a feedback loop to generate a control voltage. The second sub-circuit is a replica of the first sub-circuit, or vice-versa. In the preferred embodiment, the second sub-circuit is a scaled replica of the first sub-circuit. The sequence of steps 420 and 430 can be reversed.

At a step 440 of flow chart 400, the control voltage is used to control the output impedance of the circuit. In the preferred embodiment, the control voltage is adjusted to keep the output impedance of the circuit substantially linear across an operating range of an output voltage of the circuit.

In an alternative embodiment of flow chart 400, step 410 comprises generating a reference voltage as a function of a reference current and a reference resistance. In this embodiment of flow chart 400, steps 420, 430, and 440 remain the same.

Therefore, an improved integrated circuit and method of controlling output impedance is provided to overcome the disadvantages of the prior art. The integrated circuit has a voltage-mode driver circuit with an integral, analog on-chip termination. The integral and analog nature of the on-chip termination minimizes the problems associated with EMI and also minimizes the amount of space required on a semiconductor chip. The output impedance of the integrated circuit also behaves linearly near the supply rails.

Although the invention has been described with reference to specific embodiments, it will be understood by those skilled in the art that various changes may be made without departing from the spirit or scope of the invention. For instance, the numerous details set forth herein such as, for example, the sizes of the three-terminal devices and the resistors are provided to facilitate the understanding of the invention and are not provided to limit the scope of the invention. Furthermore, the method described by flow chart 400 can be performed by circuits other than circuits 100, 200, or 300 in FIGS. 1, 2, and 3, respectively. Moreover, the p-side of circuit 200 in FIG. 2 can be modified to include circuit 300 in FIG. 3, instead of circuit 100 in FIG. 1. In this embodiment, one skilled in the art will understand that appropriate changes will also be made to the n-side of circuit 200 in FIG. 2. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. An integrated circuit comprising:
   a first three-terminal device of a first type; and
   a second three-terminal device of the first type, a first terminal of the second three-terminal device electrically coupled to a first terminal of the first three-terminal device, and a second terminal of the second three-terminal device electrically coupled to a second terminal of the first three-terminal device, wherein:
a reference current applied to a third terminal of the second three-terminal device generates a control voltage applied to the second terminals of the first and second three-terminal devices;
where the control voltage is a function of comparing an output voltage at the third terminal of the second three-terminal device to a reference voltage; and
the reference current is derived from the reference voltage and a reference resistance.

2. The integrated circuit of claim 1 wherein:
the second three-terminal device has a different output impedance than the first three-terminal device.

3. The integrated circuit of claim 2 wherein:
the second three-terminal device has a larger output impedance than the first three-terminal device.

4. The integrated circuit of claim 1 further comprising:
a supply voltage electrically coupled to the first terminals of the first and second three-terminal devices.

5. The integrated circuit of claim 1 wherein:
the second terminal of the first three-terminal device is a first control terminal for the first three-terminal device; and
the second terminal of the second three-terminal device is a second control terminal for the second three-terminal device.

6. The integrated circuit of claim 1 further comprising:
a first resistor coupled to a third terminal of the first three-terminal device;
a second resistor coupled to the third terminal of the second three-terminal device; and
an output of the integrated circuit coupled to the first resistor, wherein:
the reference current is applied to the third terminal of the second three-terminal device through the second resistor; and
the output voltage at the third terminal of the second three-terminal device is measured from the second resistor.

7. The integrated circuit of claim 6 wherein:
an output impedance at the output of the integrated circuit comprises an output impedance of the first three-terminal device and an impedance of the first resistor.

8. The integrated circuit of claim 7 wherein:
the impedance of the first resistor is greater than the output impedance of the first three-terminal device.

9. The integrated circuit of claim 8 wherein:
the output impedance of the integrated circuit is substantially linear across an operating range of an output voltage at the output of the integrated circuit.

10. The integrated circuit of claim 1 further comprising:
an output of the integrated circuit coupled to a third terminal of the first three-terminal device; and
a capacitor coupling the second terminals of the first and second three-terminal devices to the output of the integrated circuit.

11. The integrated circuit of claim 10 wherein:
the capacitor controls a slew rate of an output voltage at the output of the integrated circuit.

12. The integrated circuit of claim 1 further comprising:
a third three-terminal device of the first type, a first terminal of the third three-terminal device electrically coupled to the first terminals of the first and second three-terminal devices, a second terminal of the third three-terminal device removably and electrically coupled to the first and second terminals of the first and second three-terminal devices, and a third terminal of the third three-terminal device electrically coupled to a third terminal of the first three-terminal device; and
a fourth three-terminal device of the first type, a first terminal of the fourth three-terminal device electrically coupled to the first terminals of the first, second, and third three-terminal devices, a second terminal of the fourth three-terminal device removably and electrically coupled to the first terminals of the first, second, and third three-terminal devices and to the second terminals of the first and second three-terminal devices.

13. The integrated circuit of claim 1 further comprising:
an output of the integrated circuit coupled to a third terminal of the first three-terminal device;
a third three-terminal device of the first type, a first terminal of the third three-terminal device coupled to a third terminal of the second three-terminal device, and a third terminal of the third three-terminal device coupled to the second terminals of the first and second three-terminal devices;
an amplifier comprising two inputs and an output, a first one of the two inputs coupled to the third terminal of the second three-terminal device and to the first terminal of the third three-terminal device, the output coupled to a second terminal of the third three-terminal device, and a second one of the two inputs coupled to the reference voltage; and
a current source providing the reference current and coupled to the third terminal of the third three-terminal device and to the second terminals of the first and second three-terminal devices.

14. The integrated circuit of claim 13 further comprising:
a first resistor coupling the output of the integrated circuit to the third terminal of the first three-terminal device; and
a second resistor coupling the third terminal of the second three-terminal device to the first one of the two inputs of the amplifier and to the first terminal of the third three-terminal device,
wherein:
the reference current is applied to the third terminal of the second three-terminal device through the second resistor and through the third three-terminal device; and
the output voltage at the third terminal of the second three-terminal device is measured from the second resistor.

15. The integrated circuit of claim 13 further comprising:
a capacitor coupling the second terminals of the first and second three-terminal devices, the third terminal of the third three-terminal device, and the current source to the output of the integrated circuit.

16. The integrated circuit of claim 15 wherein:
the capacitor controls a slew rate of an output voltage at the output of the integrated circuit.

17. The integrated circuit of claim 13 further comprising:
a first resistor coupling the output of the integrated circuit to the third terminal of the first three-terminal device;
a second resistor coupling the third terminal of the second three-terminal device to the first one of the two inputs of the amplifier and to the first terminal of the third three-terminal device; and a capacitor coupling the second terminals of the first and second three-terminal devices, the third terminal of the third three-terminal device, and the current source to the output of the integrated circuit and to the first resistor;

wherein:

the reference current is applied to the third terminal of the second three-terminal device through the second resistor and through the third three-terminal device;

the output voltage at the third terminal of the second three-terminal device is measured from the second resistor; and the capacitor controls a slew rate of an output voltage at the output of the integrated circuit.

18. The integrated circuit of claim 1 further comprising:

an output of the integrated circuit coupled to a third terminal of the first three-terminal device;

an amplifier comprising two inputs and an output, a first one of the two inputs coupled to a third terminal of the second three-terminal device, a second one of the two inputs coupled to the reference voltage, and the output coupled to the second terminals of the first and second three-terminal devices; and a current source providing the reference current and coupled to the first one of the two inputs of the amplifier and to the third terminal of the second three-terminal device.

19. The integrated circuit of claim 18 further comprising:

a first resistor coupling the output of the integrated circuit to the third terminal of the first three-terminal device; and a second resistor coupling the third terminal of the second three-terminal device to the first one of the two inputs of the amplifier and to the current source, wherein:

the reference current is applied to the third terminal of the second three-terminal device through the second resistor; and the output voltage at the third terminal of the second three-terminal device is measured from the second resistor.

20. The integrated circuit of claim 19 further comprising:

a capacitor coupling the second resistor, the first one of the two inputs of the amplifier, and the current source to the first resistor and the output of the integrated circuit.

21. The integrated circuit of claim 20 wherein:

the capacitor controls a slew rate of an output voltage at the output of the integrated circuit.

22. The integrated circuit of claim 18 further comprising:

a first resistor coupling the output of the integrated circuit to the third terminal of the first three-terminal device;

a second resistor coupling the third terminal of the second three-terminal device to the first one of the two inputs of the amplifier and to the current source; and a capacitor coupling the second resistor, the first one of the two inputs of the amplifier, and the current source to the first resistor and to the output of the integrated circuit, wherein:

the reference current is applied to the third terminal of the second three-terminal device through the second resistor;

the output voltage at the third terminal of the second three-terminal device is measured from the second resistor; and the capacitor controls a slew rate of an output voltage at the output of the integrated circuit.

23. A driver circuit comprising:

a first MOSFET having a first gate electrode, a first drain electrode, and a first source electrode;

a first resistor coupled to the first drain electrode;

an output of the driver circuit coupled to the first resistor;

a second MOSFET having a second gate electrode, a second drain electrode, and a second source electrode, the first and second gate electrodes coupled together and the first and second source electrodes coupled together;

a second resistor coupled to the second drain electrode;

a third MOSFET having a third gate electrode, a third drain electrode, and a third source electrode, the third source electrode coupled to the second resistor;

an amplifier having a first amplifier input, a second amplifier input, and an amplifier output, the first amplifier input coupled to the second resistor and the third source electrode, the second amplifier input coupled to a reference voltage, and the amplifier output coupled to the third gate electrode; and a current source coupled to the third drain electrode, the first gate electrode, and the second gate electrode.

24. The driver circuit of claim 23 wherein:

the second MOSFET has a larger output impedance than the first MOSFET; and the second resistor has a larger impedance than the first resistor.

25. The driver circuit of claim 24 wherein:

an output impedance of the driver circuit at the output of the driver circuit comprises an output impedance of the first MOSFET and an impedance of the first resistor;

the impedance of the first resistor is greater than the output impedance of the first MOSFET such that the output impedance of the driver circuit is substantially linear.

26. The driver circuit of claim 25 further comprising:

a capacitor coupling output of the driver circuit to the third drain electrode, the first and second gate electrodes, and the current source to control a slew rate of an output voltage at the output of the driver circuit.

27. The driver circuit of claim 25 further comprising:

a fourth MOSFET having a fourth gate electrode, a fourth drain electrode, and a fourth source electrode, the fourth drain electrode coupled to the first resistor and the first drain electrode, and the fourth source electrode coupled to the first and second source electrodes; and a first switch coupling the fourth gate electrode to the first and second gate electrodes and the current source.

28. The driver circuit of claim 27 further comprising:

a fifth MOSFET having a fifth gate electrode, a fifth drain electrode, and a fifth source electrode, the fifth drain electrode coupled to the first resistor and the first and fourth drain electrodes, and the fifth source electrode coupled to the first, second, and fourth source electrodes;

a second switch coupling the fifth gate electrode to the first and second gate electrodes and the current source;

a third switch coupling the fifth gate electrode to the first, second, fourth and fifth source electrodes; and a fourth switch coupling the fourth gate electrode to the first, second, fourth, and fifth source electrodes.

29. The driver circuit of claim 28 further comprising:

a capacitor coupling the output of the driver circuit and the first resistor to the first and second gate electrodes, the third drain electrode, and the current source to control a slew rate of an output voltage at the output of the driver circuit.

30. The driver circuit of claim 29 further comprising:

a fifth switch coupling the first and second gate electrodes, the capacitor, the third drain electrode, and the current source to the first, second, fourth, and fifth source electrodes, wherein:
the first and fourth switches are simultaneously opened and closed; and
the second and third switches are simultaneously opened and closed.

31. A method of controlling output impedance of a driver circuit comprising:

generating a reference voltage as a function of a reference current and a reference resistance;

using a first sub-circuit to generate the output impedance of the driver circuit;

using a second sub-circuit with a feedback loop to generate a control voltage; and using the control voltage to control the output impedance.

32. The method of claim 31 wherein:

the second sub-circuit is a replica of the first sub-circuit.

33. The method of claim 32 wherein:

the second sub-circuit is a scaled replica of the first sub-circuit.

34. The method of claim 31 wherein:

using the control voltage further comprises adjusting the control voltage to keep the output impedance substantially linear across an operating range of an output voltage of the driver circuit.

* * * * *